(12) United States Patent
Yagi et al.

(10) Patent No.: US 6,651,320 B1
(45) Date of Patent: Nov. 25, 2003

(54) METHOD FOR MOUNTING SEMICONDUCTOR ELEMENT TO CIRCUIT BOARD

(75) Inventors: Yoshihiko Yagi, Ashiya (JP); Hiroyuki Otani, Ikoma (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/509,693

(22) PCT Filed: Sep. 30, 1998

(86) PCT No.: PCT/JP98/04401
§ 371 (c)(1), (2), (4) Date: Mar. 30, 2000

(87) PCT Pub. No.: WO99/18766
PCT Pub. Date: Apr. 15, 1999

(30) Foreign Application Priority Data

Oct. 2, 1997 (JP) .............................................. 9-269665

(51) Int. Cl.[7] .................................................. H05K 3/34
(52) U.S. Cl. ............................. 29/840; 29/832; 29/841; 29/843; 29/855; 156/285
(58) Field of Search .......................... 29/832, 840, 841, 29/843, 855, 890; 156/285; 228/1.1, 110.1; 264/230

(56) References Cited

U.S. PATENT DOCUMENTS

| | | | | |
|---|---|---|---|---|
| 4,661,192 A | | 4/1987 | McShane | 156/292 |
| 4,774,634 A | | 9/1988 | Tate et al. | 361/400 |
| 5,210,938 A | | 5/1993 | Hirai | 29/840 |
| 5,355,580 A | * | 10/1994 | Tsukada | 29/840 |
| 5,404,408 A | | 4/1995 | Strohmaier et al. | 381/68.7 |
| 5,683,942 A | * | 11/1997 | Kata | 437/209 |
| 5,773,083 A | * | 6/1998 | Fischer | 427/240 |
| 5,789,820 A | * | 8/1998 | Yamashita | 257/787 |
| 5,820,716 A | | 10/1998 | Tuttle | 156/85 |
| 5,844,320 A | * | 12/1998 | Ono | 257/778 |
| 5,990,546 A | * | 11/1999 | Igarashi | 257/700 |
| 6,100,112 A | | 8/2000 | Amano et al. | 438/106 |

FOREIGN PATENT DOCUMENTS

| | | |
|---|---|---|
| EP | 0 521 672 | 1/1993 |
| EP | 525 355 A1 | 2/1993 |
| EP | 0 525 355 | 2/1993 |
| EP | 603 928 A1 | 6/1994 |
| EP | 645 805 A2 | 3/1995 |
| JP | 08213425 A * | 8/1996 |
| JP | 09092654 A * | 4/1997 |

* cited by examiner

*Primary Examiner*—Peter Vo
*Assistant Examiner*—Paul Kim
(74) *Attorney, Agent, or Firm*—Wenderoth, Lind & Ponack, L.L.P.

(57) ABSTRACT

The present invention provides a method for mounting a semiconductor element to a circuit board and a semiconductor device whereby connection reliability and connection strength in bonding of the semiconductor element and circuit board are enhanced and a connection resistance value is stabilized low. An insulating adhesive is applied to an opposite face of a circuit board. The circuit board is then connected with a semiconductor element by a conductive adhesive and the insulating adhesive which are interposed between an electrode on the circuit board and the projecting electrode and set in the same process. The circuit board and semiconductor element are connected by the insulating adhesive in addition to the conductive adhesive, so that connection reliability and connection strength are high and a connection resistance value is stabilized low.

6 Claims, 15 Drawing Sheets

METHOD FOR MOUNTING SEMICONDUCTOR ELEMENT TO CIRCUIT BOARD

TECHNICAL FIELD

The present invention relates to a method for mounting a semiconductor element to a circuit board, which is used for electrically connecting projecting electrodes, i.e., bumps on the semiconductor element to electrodes on the circuit board, and a semiconductor device having the semiconductor element mounted on the circuit board according to the method.

BACKGROUND ART

U.S. Pat. No. 4,661,192 discloses in the published specification a method for forming bumps on a semiconductor element by ball bonding and a method for bonding the semiconductor element. The conventional methods will be described.

In FIG. 25, a high voltage of several thousand volts is impressed from a discharge electrode (torch) 17 to a leading end 16a of an Au wire 16 extending from a leading end of a capillary 15. While a discharge current flows between the torch 17 and the leading end 16a of the wire, the wire 16 is heated to a high temperature from the leading end 16a and then melted, resulting in a gold ball 18 as shown in FIG. 26. The ball 18 is fixed onto an electrode 3a of a semiconductor element 3 by the capillary 15, thereby forming a bump bottom part 19 as in FIG. 27. Thereafter, the capillary 15 is pulled upward as in FIG. 28. The capillary 15 is looped above the bump bottom part 19, so that the wire 16 is tightly adhered to the bump bottom part 19, and then the wire is cut. A bump 20 is formed in this manner.

A semiconductor element 3 having the bumps 20 formed as above is pressed against a stage 14 having a flat face as shown in FIG. 29. As a result thereof, leading end parts of the bumps 20 are flattened. Then, as indicated in FIG. 30, the semiconductor element 3 with the flattened bumps 20 is brought into contact with a conductive adhesive 6 applied on a stage 5 to transfer the conductive adhesive 6 to the flattened bumps 20. In FIG. 31, the semiconductor element 3 having the bumps 20 with the conductive adhesive 6 transferred thereon is registered with electrodes 2 on a circuit board 1 and then fixed thereto, whereby the semiconductor element is electrically connected to the circuit board 1.

As described hereinabove, conventionally, the semiconductor element 3 and circuit board 1 are bonded only by the conductive adhesive 6 transferred to the bumps 20 of the semiconductor element 3. As such, the bonding between the semiconductor element 3 and circuit board 1 has merely a bonding strength of an area at the leading ends of the bumps 20 of the semiconductor element 3, and the conductive adhesive 6 exerts a strength as low as 1–2.0 g at every bonded part because only a small amount of the conductive adhesive 6 is used so as to lower a volume resistivity. Such inconveniences are realized when the bonded part cracks because of a warp of the circuit board 1 or a stress when the conductive adhesive 6 is set, a connection resistance value is increased, and a disconnection at the bonded part arises.

SUMMARY OF THE INVENTION

An object of the present invention is therefore to provide a method for mounting a semiconductor element to a circuit board whereby connection reliability and connection strength are enhanced in bonding between the semiconductor element and circuit board, and a connection resistance value is stabilized to be low. Another object is to provide a semiconductor device having a semiconductor element mounted to a circuit board by the method.

In order to accomplish the above-described objects, according to a first aspect of the present invention, a method is provided for mounting a semiconductor element to a circuit board. The method comprises:

disposing an insulating adhesive having a property of shrinking upon being set, at least at either of opposite faces confronting each other of the circuit board and the semiconductor element;

registering the circuit board and the semiconductor element so that an electrode on the circuit board corresponds to a projecting electrode on the semiconductor element;

coupling the opposite faces of the circuit board and semiconductor element by the insulating adhesive; and setting the insulating adhesive, so that the electrode on the circuit board and the projecting electrode on the semiconductor element are electrically connected through the shrinkage of the insulating adhesive such that the semiconductor element and circuit board are fixed in a coupled state.

A semiconductor device according to a second aspect of the present invention has a semiconductor element mounted to a circuit board according to the above mount method of the first aspect.

According to the mount method for a semiconductor element to a circuit board of the first aspect and the semiconductor device of the second aspect, the semiconductor element and circuit board are connected with the use of the insulating adhesive, and therefore connected rigidly in comparison with the conventional art whereby the connection is achieved only by the projecting electrodes of the semiconductor element and the electrodes of the circuit board. Therefore, a connection resistance value at a projecting electrode of the semiconductor element and a corresponding electrode of the circuit board is reduced and less varied, and at the same time, connection strength is high, thereby realizing highly reliable bonding.

BRIEF DESCRIPTION OF DRAWINGS

These and other aspects and features oft he present invention will become clear from the following description taken in conjunction with the preferred embodiments thereof with reference to the accompanying drawings in which.

DESCRIPTION OF THE PREFERRED EMBODIMENTS

Figure 1:
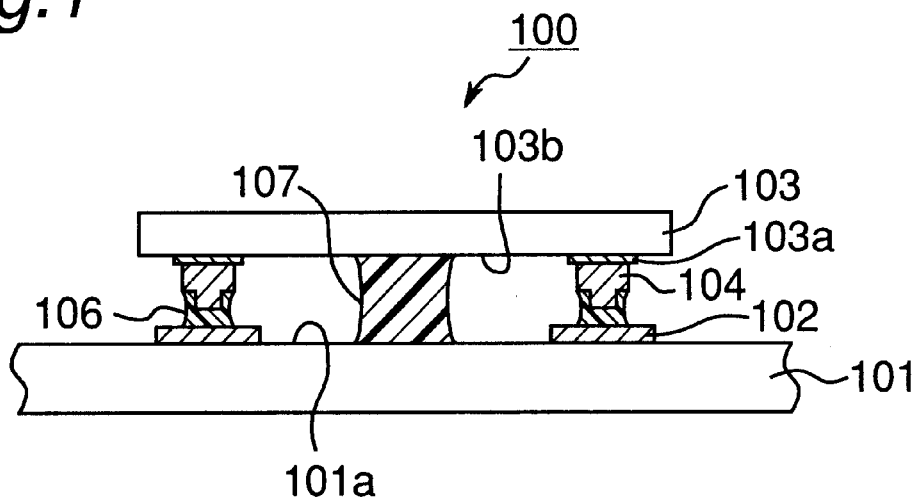
FIG. 1 is a sectional view showing the structure of a semiconductor device in an embodiment of the present invention.

A method for mounting a semiconductor element to a circuit board according to a preferred embodiment of the present invention, and a semiconductor device having a semiconductor element mounted to a circuit board by the method will be described with reference to the drawings throughout which like parts are designated by like reference numerals.

FIG. 1 shows a semiconductor device 100 in which a semiconductor element 103 is mounted to a circuit board 101 according to a mount method in the preferred embodiment. The mount method for obtaining the semiconductor device 100 will be discussed hereinbelow.

Similar to the conventional semiconductor element described with reference to FIGS. 25–29, a projecting electrode 104 as a bump is formed on an electrode 103a of the semiconductor element 103. The projecting electrodes 104 are pressed to a flat face of a stage, so that leading end parts of the projecting electrodes are flattened and at the same time, made uniform in height from a surface of the semiconductor element 103. The projecting electrodes 104 are preferably formed of Au, Ni, Al, Cu or solder by plating or conventional ball bonding with the use of a wire described earlier. The formation method is not limited to the above.

Figure 2:
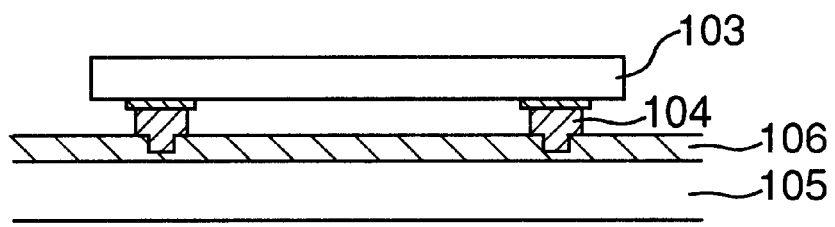
FIG. 2 is a diagram of one step of a manufacture process of the semiconductor device of FIG. 1, particularly in a state where a conductive adhesive is transferred to projecting electrodes of a semiconductor element.
Figure 20:
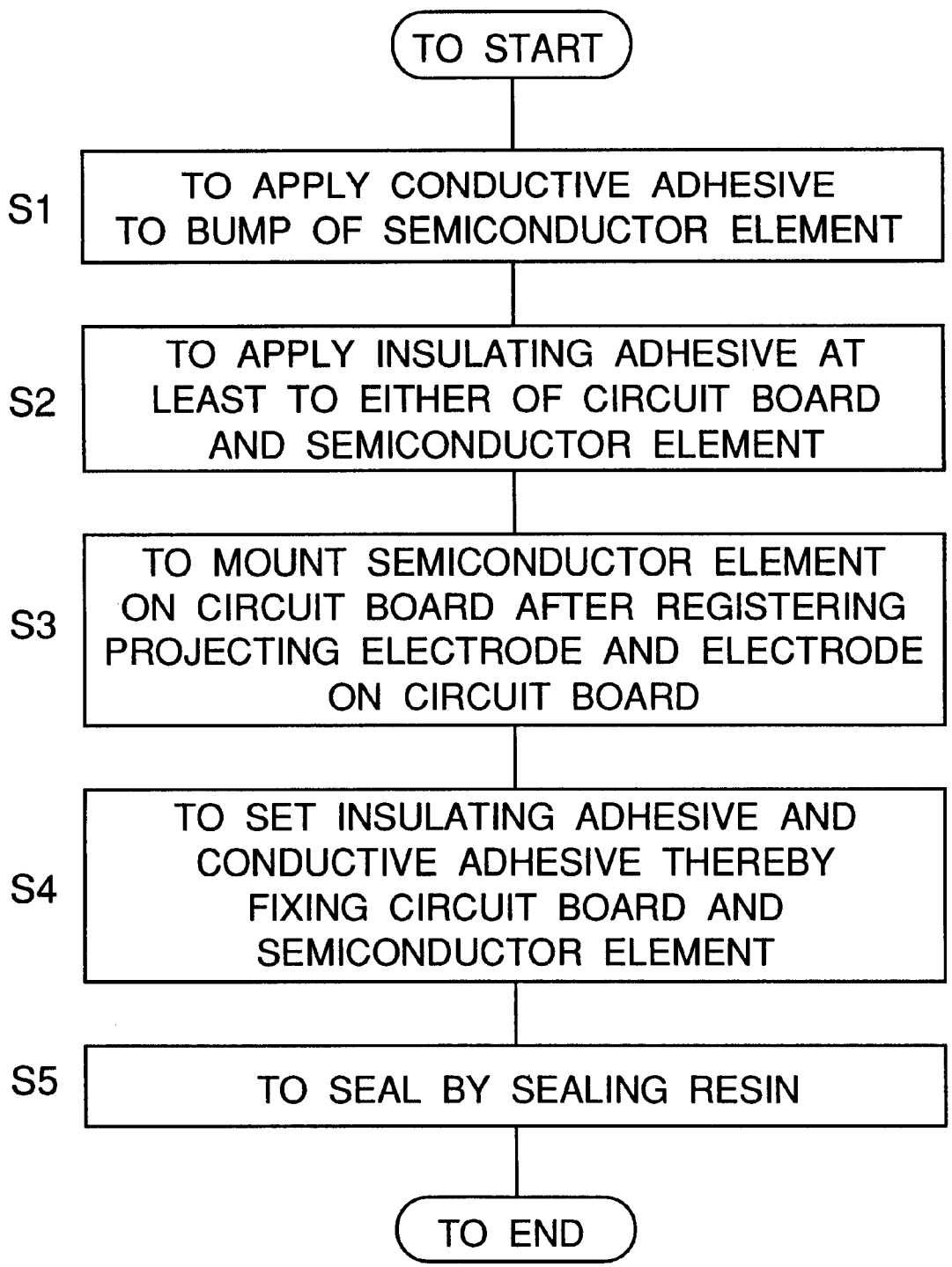
FIG. 20 is a flow chart of an operation of a method for mounting a semiconductor element to a circuit board according to an embodiment of the present invention.

As indicated in FIG. 2 and a step S1 in FIG. 20, each leading end part of the projecting electrodes 104 of the semiconductor element 103 is brought into contact with a conductive adhesive 106 applied on the flat face of the stage, whereby the conductive adhesive 106 is transferred to the leading end parts. The conductive adhesive 106 is any kind of filler having conductive properties, e.g., silver, gold or the like and not limited in material.

Figure 3:
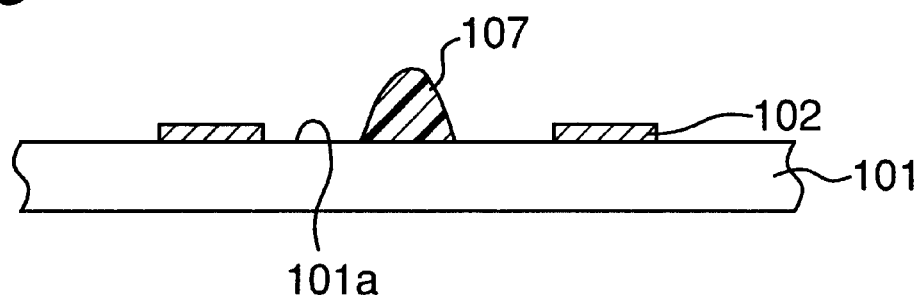
FIG. 3 is a diagram of one step of the manufacture process of the semiconductor device of FIG. 1, particularly in a state where an insulating adhesive is transferred onto a circuit board.

On the other hand, as shown in FIG. 3 and a step S2 in FIG. 20, in forming the semiconductor device 100 according to the present embodiment, a thermosetting insulating adhesive 107 is applied on an opposite face 101a confronting the semiconductor element 103 at a position not in touch with electrodes 102 which are to be connected to the projecting electrodes 104. Concretely, the insulating adhesive 107 is anything such as an epoxy-series resin, a silicone-series resin, a polyimide-series resin, etc. so long as it shrinks and sets by heat. As will be described later, the insulating adhesive 107 is heated in a range of 60–200° C., preferably at 120° C. in the case of the epoxy-series resin for 15 minutes to 2 hours, preferably for one hour so as to set and shrink in the same process that the conductive adhesive 106 of the projecting electrodes 104 is set. Moreover, because of the need for the insulating adhesive 107 on the circuit board 101 to adhere to an opposite face 103b of the semiconductor element 103 to thereby couple the opposite faces 101a and 103b when the semiconductor element 103 is arranged on the circuit board 101, the insulating adhesive 107 should be formed like a projection on the circuit board 101 as illustrated in FIG. 3 if the insulating adhesive 107 is in liquid state. For this reason, the insulating adhesive 107 has, when it is in liquid state, a viscosity of 4–300 Pas, preferably 30 Pas.

In the description of the embodiment, the semiconductor element 103 to which the insulating adhesive 107 is applied or adhered is exemplified in the form of one chip, but not restricted to this form and may be a wafer before cut to one chip.

An example of physical properties of the insulating adhesive 107 formed of epoxy-series resin is indicated hereinbelow. The insulating adhesive 107 is set by heating at 120° C. for 30 minutes. A thermal expansion coefficient is $29 \times 10^{-6}/°$ C., a Young's modulus is 10.5 GPa, a glass transition point is 113° C., a bonding strength is 88.26 N and a setting stress is $882.6 \times 10^6$ Pa.

The setting stress applied to the semiconductor element 103 when the insulating adhesive 107 is set and shrunken has the risk of causing damage to the semiconductor element 103. While the setting stress changes in accordance with a thickness and a size of the semiconductor element 103, a material and a breadth of a wiring, and a thickness, a size and a material of the circuit board 101, when the semiconductor element is silicon and is 0.4 mm thick and 10 mm square, and the circuit board is formed of 0.8 mm thick glass epoxy resin, the setting stress within $392.3 \times 10^6$–$1176.8 \times 10^6$ Pa never damages the semiconductor element. In other words, if the insulating adhesive 107 used applies the setting stress as above to the semiconductor element 103 and circuit board 101 when set and shrunken, the damage to the semiconductor element 103 and circuit board 101 can be avoided.

In step S3 of FIG. 20, the projecting electrodes 104 of the semiconductor element 103 are registered on the electrodes 102 of the circuit board 101 and subsequently bonded to the electrodes 102 on the circuit board 101 by the conductive adhesive 106. As a result of the registering, the interposed insulating adhesive 107 couples the opposite face 101a of the circuit board 101 to the opposite face 103b of the semiconductor element 103 between the semiconductor element 103 and circuit board 101.

Then in step S4 of FIG. 20, the semiconductor element 103 and circuit board 101, i.e., the conductive adhesive 106 and insulating adhesive 107 are set in the same process by a cure oven heating and setting the insulating adhesive 107 and conductive adhesive 106, or by a heating tool with a heater heating at least one of the semiconductor element 103 and circuit board 101. As a result, the semiconductor device 100 shown in FIG. 1 is obtained. At this time, the circuit board 101 and semiconductor element 103 are not temporarily fixed, but permanently set by the setting of the conductive adhesive 106 and insulating adhesive 107.

A heating temperature in the cure oven is 120±10° C. in the embodiment in the case of the epoxy-series resin adhesive. The conductive adhesive 106 and insulating adhesive 107 are set under the same conditions.

In the step S4, the insulating adhesive 107 is adapted to be set and shrunken earlier than the conductive adhesive 106. The reason for adapting such timing is that if the conductive adhesive 106 were set earlier in a state without the projecting electrodes 104 and the electrodes 102 on the circuit board 101 bonded, the defective bonded state cannot be repaired after the setting and shrinking of the insulating adhesive 107. The setting is executed with a timing, for instance, that the insulating adhesive 107 is set and shrunken in 25 minutes and the conductive adhesive 106 is set in 40 minutes at a setting temperature of 100° C., the insulating adhesive 107 is set and shrunken in 20 minutes and the conductive adhesive 106 is set in 35 minutes at a setting temperature of 120° C., or the insulating adhesive 107 is set and shrunken in 10 minutes and the conductive adhesive 106 is set in 20 minutes at a setting temperature of 150° C.

In order to set and shrink the insulating adhesive 107 earlier than the conductive adhesive 106 with the above-described timing, and also to surely bond the projecting electrodes 104 to the electrodes 102 on the circuit board 101 by the insulating adhesive 107 that has set and shrunk earlier without causing damage, e.g., cracks or the like to the semiconductor element 103, the insulating adhesive 107 that has the above-described physical properties is employed. Moreover, in order to secure a timing shift of the setting, the insulating adhesive 107 is adapted to have a gelling time and a setting time which are earlier than those of the conductive adhesive 106. Further, the insulating adhesive 107 is adapted to be set at a lower temperature so as not to damage the semiconductor element 103 by the setting and shrinking thereof. A difference of the gelling time and the setting time between the insulating adhesive 107 and conductive adhesive 106 is due to a difference of components. That is, the insulating adhesive 107 is set as an adhesive component contained in the insulating adhesive 107 is set, while, the conductive adhesive 106 is dried and solidified when a solvent component such as BCA (butyl Carbitol acetate) contained in the conductive adhesive 106 evaporates. The presence/absence of the solvent component is one reason for the difference of the gelling time and setting time.

The setting stress applied to the semiconductor element 103 and circuit board 101, i.e., internal stress changes corresponding to a setting temperature, for example, $490.3 \times 10^6$ Pa at 100° C. for 30 minutes, $882.6 \times 10^6$ Pa at 120° C. for 30 minutes and $1520.0 \times 10^6$ Pa at 150° C. for 15 minutes. Therefore, not only the timing shift of the setting is required, but the setting stress should be $392.3 \times 10^6$–$1176.8 \times 10^6$ Pa as mentioned earlier.

Since the semiconductor element 103 and circuit board 101 are connected by the insulating adhesive 107 as well as by the conductive adhesive 106, connection strength between the circuit board 101 and semiconductor element 103 is increased due to the setting and shrinking of the insulating adhesive 107 as compared with the conventional art in spite of the stress impressed to the connected part between the projecting electrodes 104 and electrodes 102 of the circuit board 101 due to a difference of thermal expansion coefficients of the circuit board 101 and semiconductor element 103, and a warp of the circuit board 101. Accordingly, a connection resistance between the projecting electrodes 104 and electrodes 102 of the circuit board 101 is decreased and less varied, and at the same time, the semiconductor element 103 and circuit board 101 are bonded stably and highly reliably with a large connection strength.

Although the insulating adhesive 107 is applied onto the circuit board 101 in order to simplify the manufacture process in the foregoing description, the insulating adhesive 107 may be applied to the opposite face 103b of the semiconductor element 103, or both opposite faces 101a and 103b of the circuit board 101 and semiconductor element 103.

Figure 5:
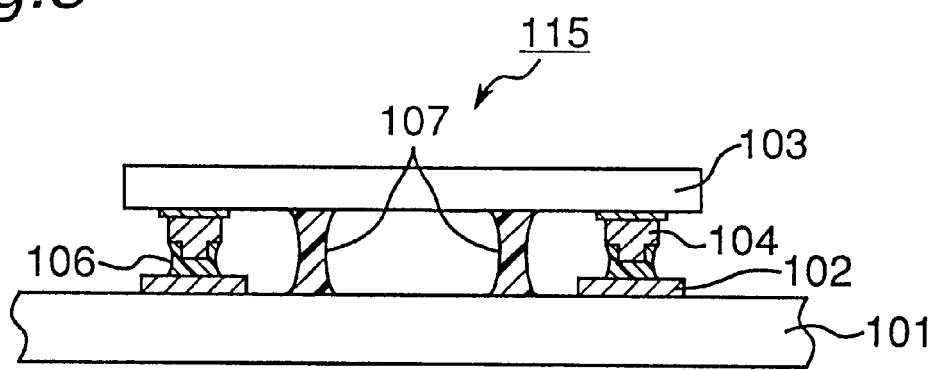
FIG. 5 is a sectional view of a further modified example of the semiconductor device of FIG. 1.
Figure 6:
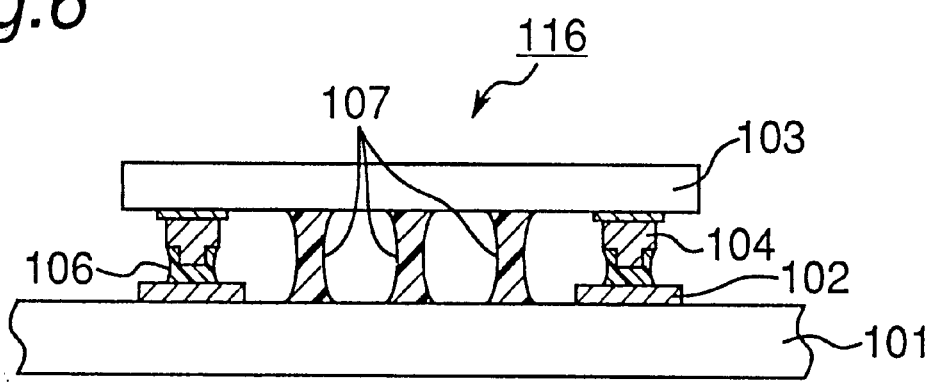
FIG. 6 is a sectional view of a yet another modified example of the semiconductor device of FIG. 1.
Figure 7:
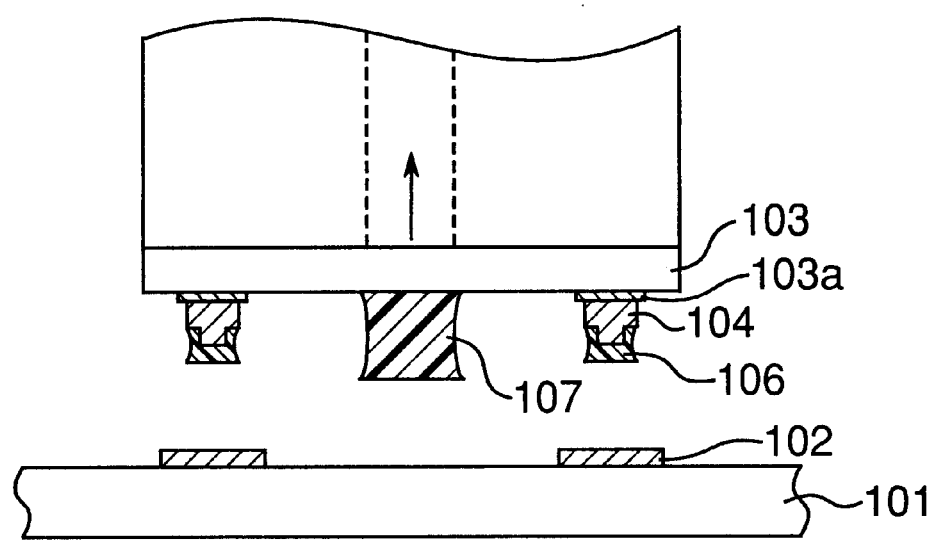
FIG. 7 is a diagram of a state where a part of the semiconductor element is removed in the semiconductor device of FIG. 1.

In addition, although the insulating adhesive 107 is applied only at one point between the semiconductor element 103 and circuit board 101 as indicated in FIG. 1, the present invention is not limited to this and the insulating adhesive 107 can be applied at a plurality of points as in semiconductor devices 115, 116 shown in FIGS. 5, 6 in accordance with an increase of an area of the semiconductor element 103. When the insulating adhesive 107 is applied at two or more points, the amount of the insulating adhesive 107 applied once is reduced, so that variations in the application amount is decreased, thereby enabling a constant amount of the insulating adhesive 107 to be applied. The insulating adhesive 107 is prevented from spreading to the electrodes 102 of the circuit board 101 when the semiconductor element 103 is mounted on the circuit board 101.

When the semiconductor element 103 and circuitboard 101 are connected with each other as in FIGS. 1, 5 and 6, if the insulating adhesive 107 is disposed so as not to adhere any of the electrodes 103a of the semiconductor element 103 and electrodes 102 of the circuit board 101, the following effects are realized. In the event the semiconductor element 103 is detected to be defective after being mounted to the circuit board, the insulating adhesive 107 of epoxy-series resin not adhering to at least one of the electrodes 102 on the circuit board 101 can be softened by heating the defective semiconductor element to about 200–230° C., which is a temperature not lower than the glass transition point of the insulating adhesive, to be reduced in bond strength. The insulating adhesive 107 can hence be separated from the circuit board 101, and the semiconductor element 103 can be removed in about 15 seconds from the circuit board 101. Thus, the circuit board 101 can be used again, to which a good semiconductor element 103 can be mounted.

Figure 4:
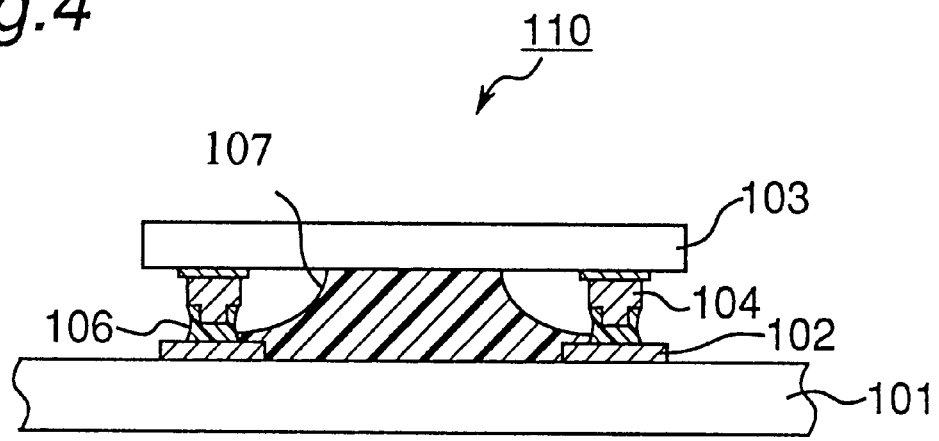
FIG. 4 is a sectional view of a modified example of the semiconductor device of FIG. 1.

Although the aforementioned effect is lost, the insulating adhesive 107 may be disposed to adhere to the electrode 102 of the circuit board 101 as in a semiconductor device 110 of FIG. 4, or adhere to both the electrode 103 a of the semiconductor element 103 and the electrode 102 of the circuit board 101.

The insulating adhesive 107 in the foregoing description is in liquid state. However, the insulating adhesive may be molded into a pellet or be a film, whereby the amount of the insulating adhesive 107 supplied varies less. The insulating adhesive 107 of a constant amount can be supplied.

Figure 14:
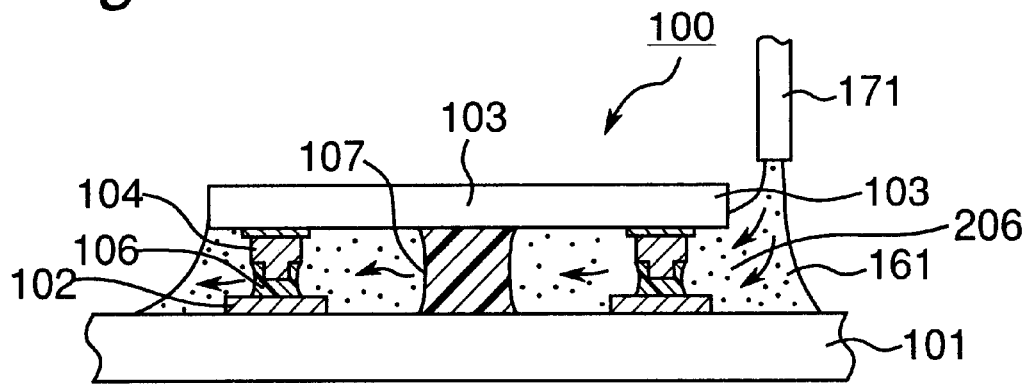
FIG. 14 is a diagram of a state where a sealing resin is injected into the semiconductor device of FIG. 1.
Figure 15:
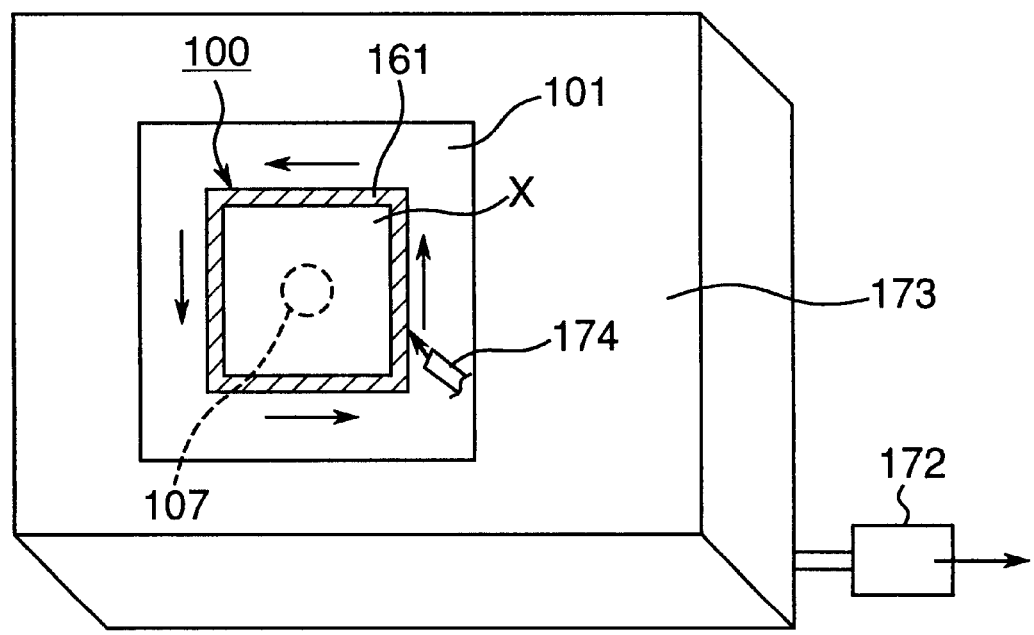
FIG. 15 is a diagram showing the constitution of an apparatus for injecting the sealing resin into the semiconductor device of FIG. 1.
Figure 21:
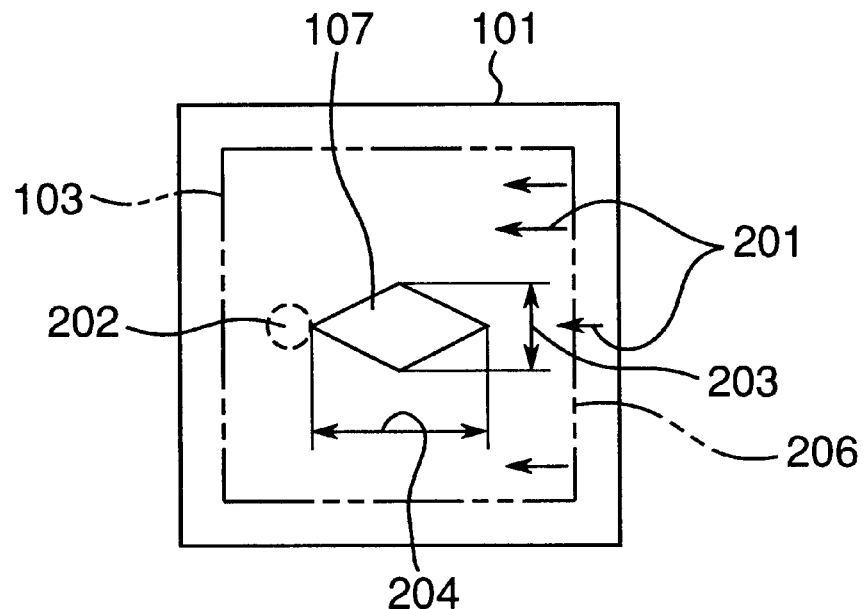
FIG. 21 is a plan view of an arrangement of a rectangular insulating adhesive when the sealing resin is injected into the semiconductor device of FIG. 1 in one direction.
Figure 22:
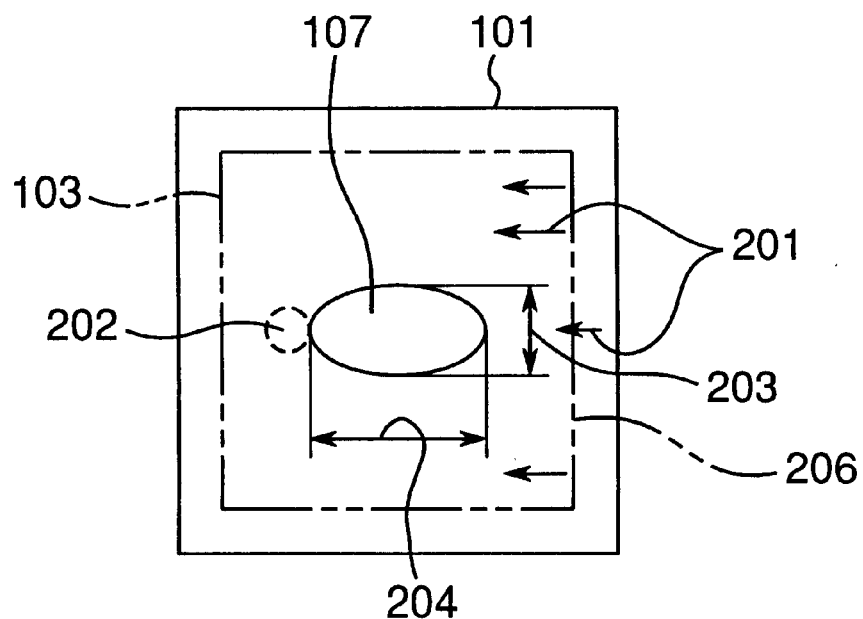
FIG. 22 is a plan view of an arrangement of an elliptical insulating adhesive when the sealing resin is injected into the semiconductor device of FIG. 1 in one direction.

At this time, the insulating adhesive 107 shaped as a pellet or film is preferably rectangular or elliptical in a plane and has a length-to-breadth ratio of not smaller than 1. As will be described later, a first sealing resin 161 is injected into a gap between the semiconductor element 103 and circuit board 101 as shown in FIG. 14 after the semiconductor element 103 and circuit board 101 are fixed by the insulating adhesive 107. When the first sealing resin 161 is injected into the gap from a side end face and a neighboring part 206 of the semiconductor element 103 in one direction as represented by arrows 201 in FIGS. 21 and 22, air bubbles are formed at a rear end part 202 of the insulating adhesive 107 in the injection direction of the arrow 201, resulting in the formation of a void part. For eliminating the air bubbles, therefore, the insulating adhesive 107 is arranged to be streamlined in the injection direction, and further the insulating adhesive 107 is arranged in plane so that a ratio of a lateral size 204 thereof in the injection direction of the arrow 201 to a longitudinal size 203 thereof in a direction orthogonal to the injection direction is not smaller than 1.

The above condition of the length-and-breadth ratio of not smaller than 1 can be applied also to a planar shape of the applied insulating adhesive 107 when the insulating adhesive 107 is in liquid state. Since it is necessary for the pellet or film-shaped insulating adhesive 107 on the circuit board 101 to touch the opposite face 103b of the semiconductor element 103 when the semiconductor element 103 is mounted on the circuit board 101, a height of the pellet or film-shaped insulating adhesive 107 from the opposite face 101a of the circuit board 101 is such that allows this touching. For example, the pellet or film in a plane is smaller than a distance between the electrodes 103a of the semiconductor element 103 shown in FIG. 1 and has a height slightly greater than a distance between the semiconductor element 103 and circuit board 101, i.e., 20–200 $\mu$m.

In the case where the pellet or film-shaped insulating adhesive 107 is employed, the following effects are realized. As described earlier, when the insulating adhesive 107 in a liquid state is used, an application operation for the insulating adhesive 107 and a mount operation for the semiconductor element 103 onto the circuit board 101 are carried out separately as in steps S2 and S3 in FIG. 20. To the contrary, when the pellet or film-shaped insulating adhesive 107 is used, since the adhesive is solid, the pellet or film-shaped insulating adhesive 107 can be disposed between the circuit board 101 and semiconductor element 103 while the aforementioned mount operation is being performed.

Figure 8:
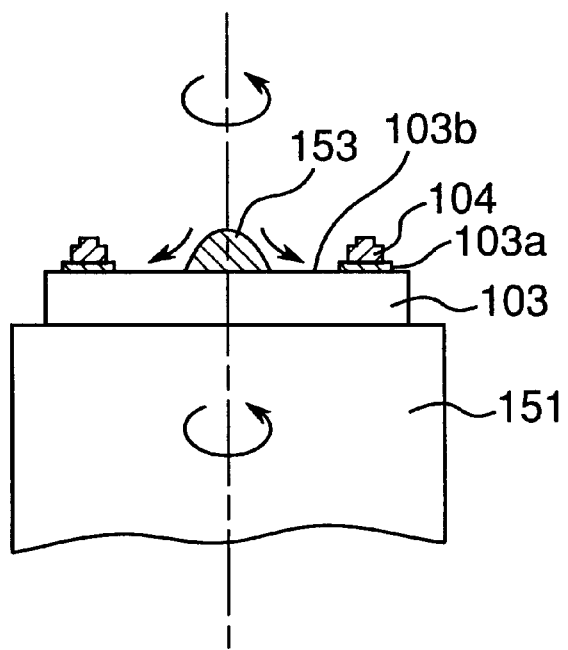
FIG. 8 is a diagram of one step of the manufacture process in a modified example of the semiconductor device of FIG. 1.
Figure 9:
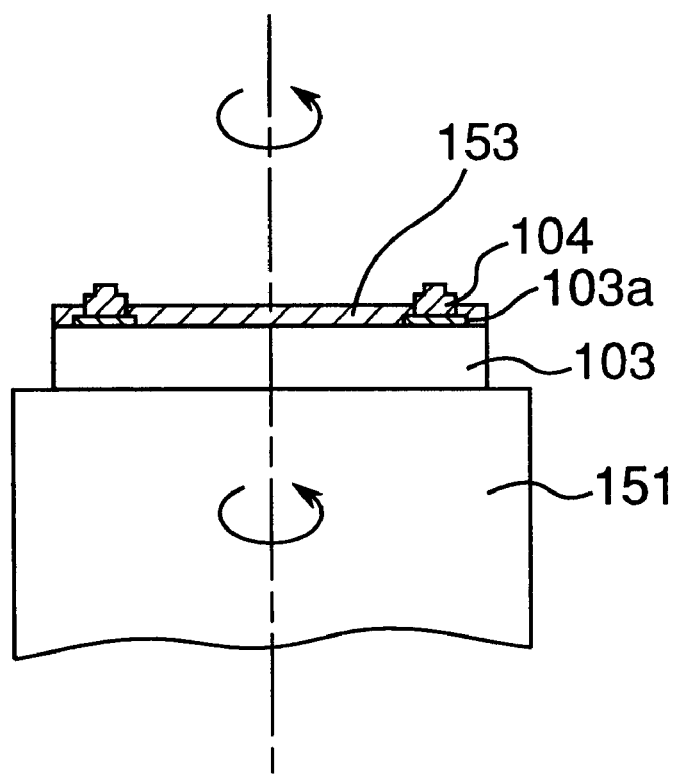
FIG. 9 is a diagram of one step of the manufacture process of the modified example of the semiconductor device of FIG. 1, specifically, a succeeding step to FIG. 8.
Figure 10:
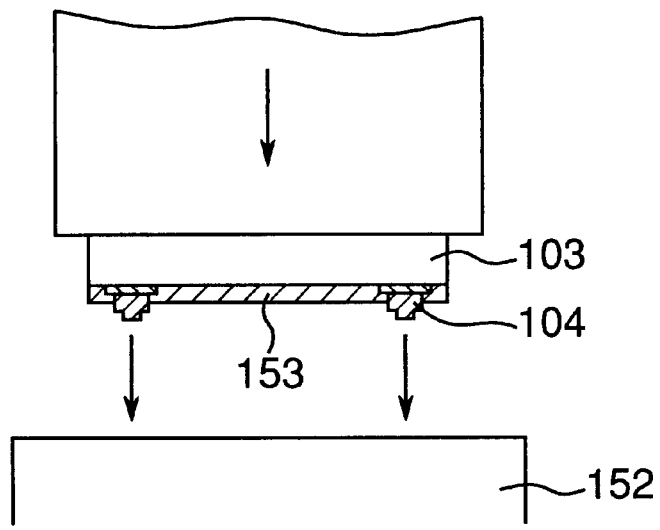
FIG. 10 is a diagram of one step of the manufacture process of the modified example of the semiconductor device of FIG. 1, specifically, a succeeding step to FIG. 9.
Figure 11:
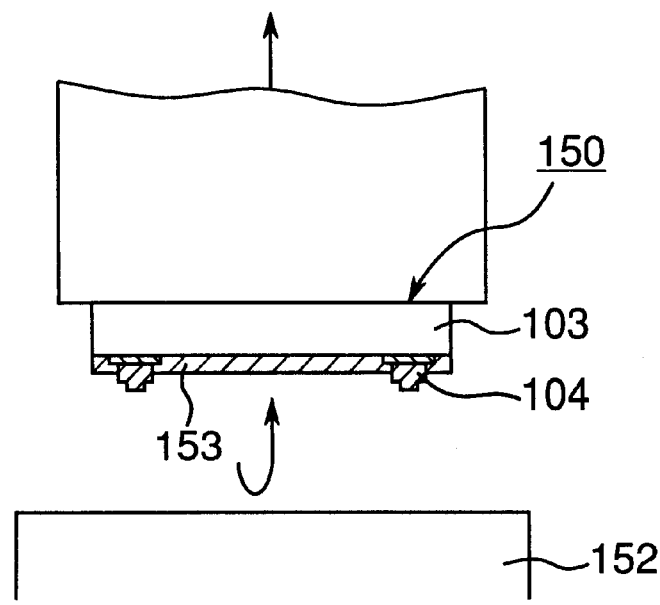
FIG. 11 is a diagram of one step of the manufacture process of the modified example of the semiconductor device of FIG. 1, specifically, a succeeding step to FIG. 10.
Figure 12:
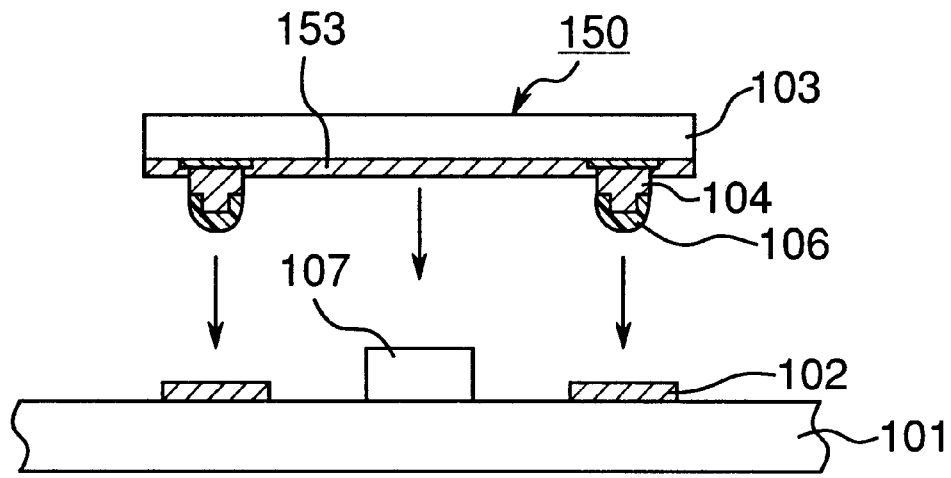
FIG. 12 is a diagram of one step of the manufacture process of the modified example of the semiconductor device of FIG. 1, specifically, a succeeding step to FIG. 11.
Figure 13:
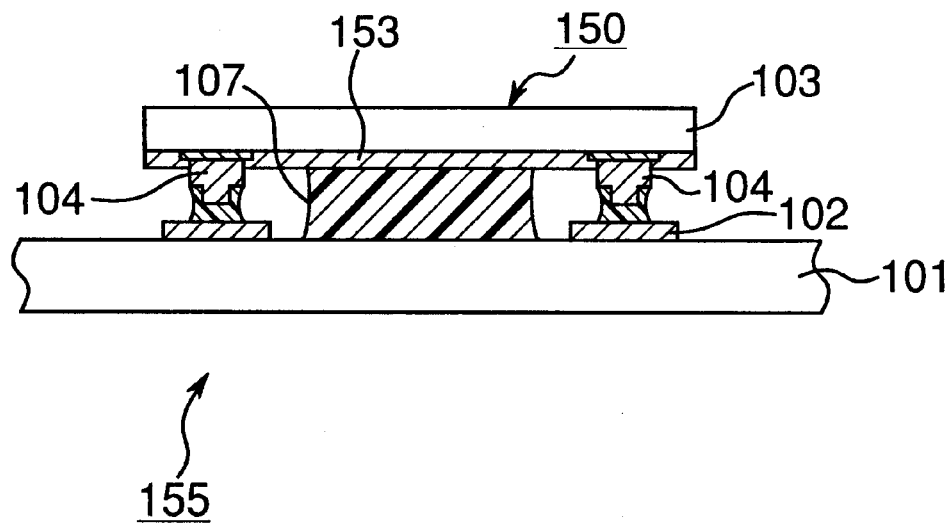
FIG. 13 is a sectional view of a modified example of the semiconductor device of FIG. 1.

Although the insulating adhesive 107 is directly adhered to the opposite face 103b of the semiconductor element 103 in the above description, as will be depicted later, an insulating resin 153 of, e.g., an epoxy-series resin may be formed at the opposite face 103b of the semiconductor element 103 beforehand, thereby constituting a semiconductor element 150, and thereafter the semiconductor element 150 is connected with the circuit board 101 by the insulating adhesive 107. More specifically, referring to FIG. 8, after the projecting electrodes 104 are formed on the electrodes 103a of the semiconductor element 103, the semiconductor element 103 is fitted on a rotary table 151. The insulating resin 153 is applied to a nearly central part on the opposite face 103b of the semiconductor element 103, and the rotary table 151 is rotated in the direction of the arrow. As a result thereof, as in FIG. 9, the insulating resin 153 is spread by a centrifugal force, so that the opposite face 103b of the semiconductor element 103 and the electrodes 103a on the periphery of the projecting electrodes 104 are covered with the insulating resin 153. But leading end parts of the projecting electrodes 104 are exposed from the insulating resin 153. The insulating resin 153 is then set. After the setting, the leading end parts of the projecting electrodes 104 are pressed against a base material 152 having a flat face, as shown in FIGS. 10 and 11, thereby making the leading end parts of the projecting electrodes 104 flat and exposed as a bond face. Afterwards, as in FIGS. 12 and 13, the conductive adhesive 106 is provided at the leading end parts of the projecting electrodes 104 as described earlier, and the insulating adhesive 107 is disposed between the semiconductor element 150 and circuit board 101, whereby the semiconductor element 150 is connected to the circuit board 101. The semiconductor device thus manufactured becomes a semiconductor device 155 shown in FIG. 13.

As described hereinabove, when the insulating resin 153 is formed on the opposite face 103b of the semiconductor element 103, the insulating resin 153 protects the semiconductor element 103 and also the electrodes 103a on the periphery of the projecting electrodes 104, and at the same time, makes the semiconductor element superiorly resistive to moisture after being mounted on the circuit board 101 and prevents the electrodes 103a of the semiconductor element 103 from being corroded. According to the semiconductor device 155, a process of injecting and setting an insulating resin in a gap between the circuit board 101 and semiconductor element 103 is effectively eliminated.

While the insulating resin 153 may not contain a material such as silica or the like controlling the thermal expansion of the insulating resin 153, if the insulating resin contains this material, it becomes almost equal to the insulating adhesive 107 in terms of components, thereby reducing a stress at an interface between the insulating resin 153 and insulating adhesive 107.

In each of the above-described semiconductor devices 100, 110, 115, 116, 155, the first sealing resin 161 is injected into the gap between the semiconductor element and circuit board, e.g., in a manner as illustrated in FIG. 14 or in step S5 of FIG. 20. The injection of the first sealing resin 161 may be omitted in the semiconductor device 155 as discussed above. An injection operation of the first sealing resin 161 will be described now by way of example of the semiconductor device 100.

As a manner of the injection method, the first sealing resin 161 is injected by a resin injection device 171 from the side end face of the semiconductor device 100 and one of parts in the vicinity of the side end face, as indicated by the reference numeral 206 in FIG. 14.

Figure 16:
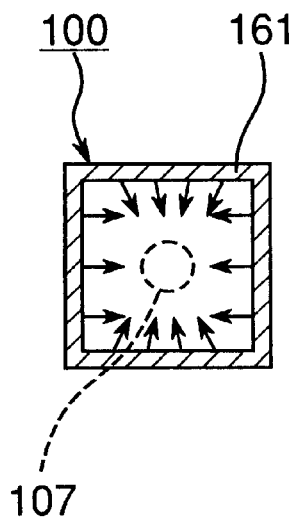
FIG. 16 is a diagram of a state where the sealing resin is being injected into the semiconductor device of FIG. 1.

Preferably, the interior of a working chamber 173 is reduced in pressure lower than atmospheric pressure by an air discharge device 172 after the semiconductor device 100 is set in the chamber 173. Under the pressure-reduced state, the first sealing resin 161 is applied onto the circuit board 101 along four sides of the semiconductor device 100 from the side end face and the neighboring part 206 of die semiconductor device 100 via a resin feed device 174 as represented by arrows. After the application is completed, the interior of the chamber 173 is returned to atmospheric pressure. Meanwhile, the gap part between the semiconductor element 103 and circuit board 101 sealed by the first sealing resin 161 applied along the four sides of the semiconductor device 100 is still in a pressure-reduced state. Because of a pressure difference, the first sealing resin 161 applied along the four sides invades the gap as shown in FIG. 16 thereby filling the gap. The amount of the first sealing resin 161 applied at this time is such that it seals the gap between the semiconductor element 103 and circuit board 101, thereby preventing invasion of moisture and corrosion, easing a thermal stress and securing reliability at the bonded part.

According to the above-described injection method, in comparison with the method of applying the insulating sealing resin from the side end part of the semiconductor element 103 and the neighboring part 206 at atmospheric pressure, the sealing resin can be injected into the gap in a shorter time. Moreover, even if the semiconductor element 103 is as large as 15×15 mm or more, the sealing resin can be injected easily in a short time.

Figure 17:
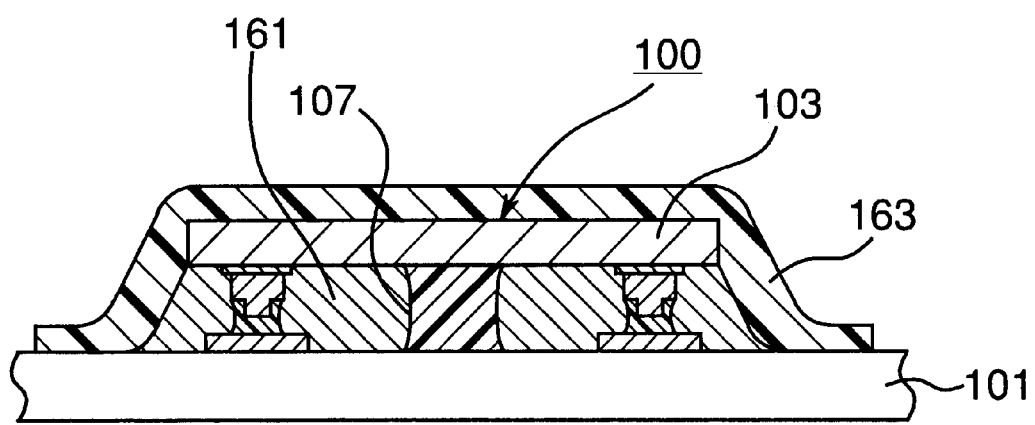
FIG. 17 is a sectional view of the semiconductor device of FIG. 1 with the sealing resin injected while coated with a heat-radiating resin.

A heat-radiating resin 163 may be provided on the semiconductor device having the first sealing resin 161 filled in the gap as described above, in a manner as shown in FIG. 17 to cover the whole face of the semiconductor device. In this case, the heat-radiating resin 163 has a thermal conductivity in a range of 0.2–2 W/mk, more preferably, 1 W/mk or larger to effectively radiate the heat generated at the semiconductor device. If alumina or a similar metallic filler of good thermal conductivity is included in the first sealing resin 161, heat radiation efficiency of the semiconductor element 103 can be improved even without the heat-radiating resin 163. When the metallic filler is used, the filler is coated with a resin coat so as to negate conductivity of the filler.

Figure 18:
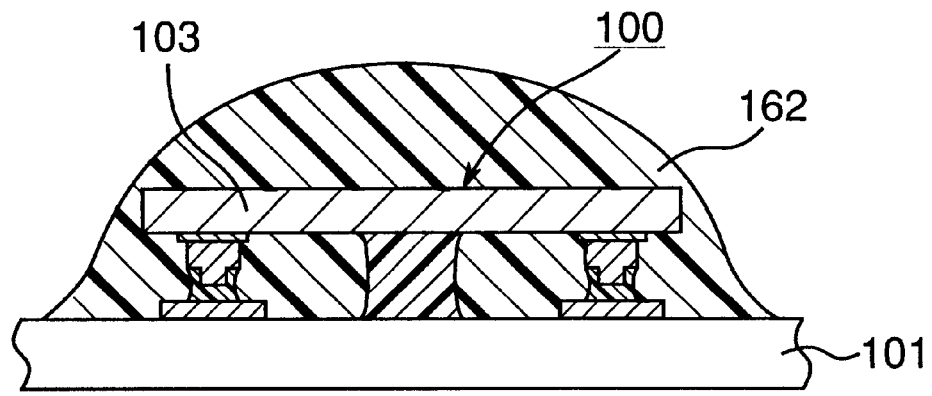
FIG. 18 is a sectional view of the semiconductor device of FIG. 1 in a state where a second sealing resin is applied thereto.
Figure 19:
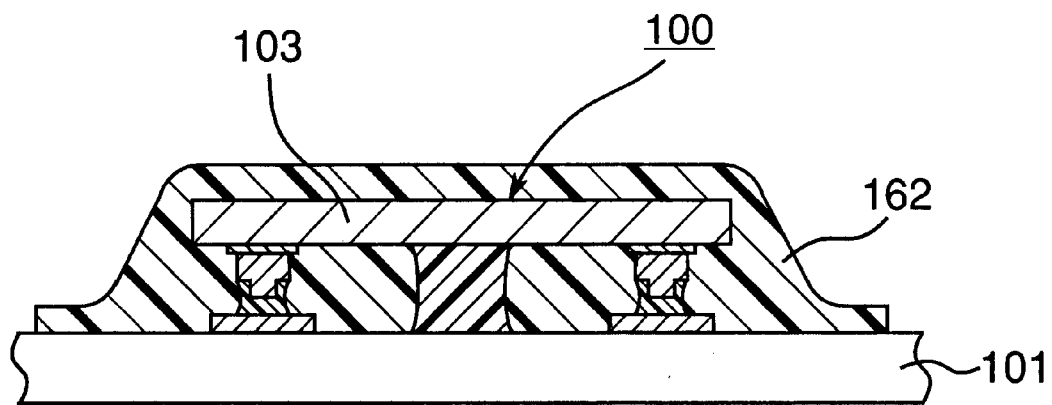
FIG. 19 is a sectional view of the semiconductor device of FIG. 1 in a state where the second sealing resin is applied thereto.

In place of the method of injecting the sealing resin, the semiconductor element 103 can be sealed by covering the semiconductor device 100, for instance, with a second sealing resin 162 as shown in FIGS. 18 and 19. The second sealing resin 162 is, e.g., film-shaped or in a liquid state. FIG. 18 shows the liquid state resin, while FIG. 19 shows a film of the resin. Concretely, after the semiconductor device 100 is heated in the chamber 173 in the pressure-reduced state, the whole face of the semiconductor element 103 is covered with the second sealing resin 162. The working chamber 173 is returned to atmospheric pressure, and the second sealing resin 162 is set, whereby the semiconductor device 100 is sealed.

Accordingly, as compared with the method of applying and injecting the insulating sealing resin from the side end face and the neighboring part 206 of the semiconductor element 103 at atmospheric pressure, the second sealing resin can be applied in a short time in the form of a sheet, which can cope with a size increase of the semiconductor element 103.

Similar to the case when the first sealing resin 161 is used, the heat-radiating resin 163 may be additionally provided, or alumina filler or the like may be included in the second sealing resin 162.

The first sealing resin 161 and second sealing resin 162 are preferably of epoxy or acrylic-series, more preferably composed of a material containing an epoxy component. The first sealing resin 161 and second sealing resin 162 may be thermoplastic resin, not restricted to thermoset resin.

Figure 23:
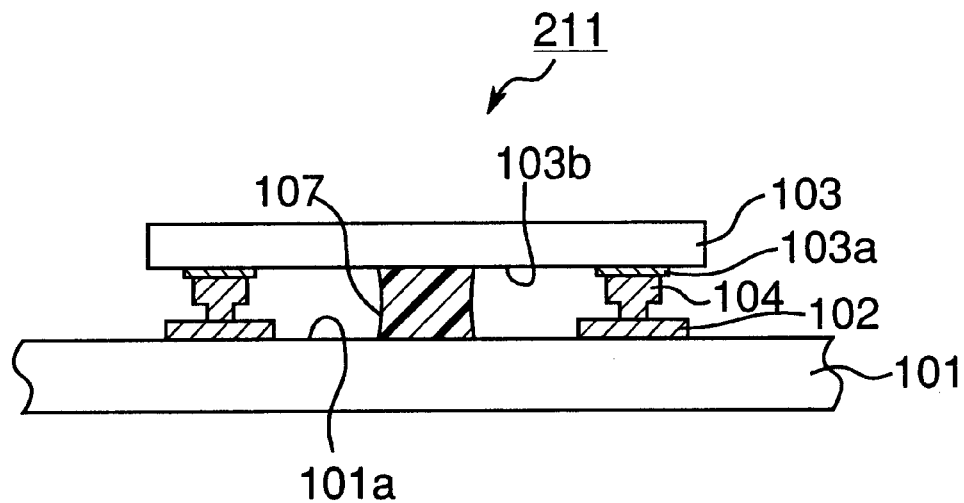
FIG. 23 is a sectional view of the semiconductor device of an embodiment in another structure without using a conductive adhesive.

In the above semiconductor devices 100, 110, 115, 116, 155, the projecting electrodes 104 are connected to the electrodes 102 on the circuit board 101 via the conductive adhesive 106. However, the conductive adhesive 106 is not necessarily required. FIG. 23 represents a semiconductor device 211 wherein the semiconductor element 103 and circuit board 101 are fixed to each other only by the insulating adhesive 107, without using the conductive adhesive 106. Since the insulating adhesive 107 has shrink properties, the semiconductor element 103 and circuit board 101 are pulled toward one another when connected via the insulating adhesive 107, and consequently the projecting electrodes 104 are butted and electrically connected to the electrodes 102 on the circuit board 101.

Even when the semiconductor element 103 and circuit board 101 are fixed only by the insulating adhesive 107 as described above, the projecting electrodes 104 are surely connected to the electrodes 102 on the circuit board 101 via the insulating adhesive 107. However, it is better to also use the conductive adhesive 106 to enhance connection reliability as described earlier.

Figure 24:
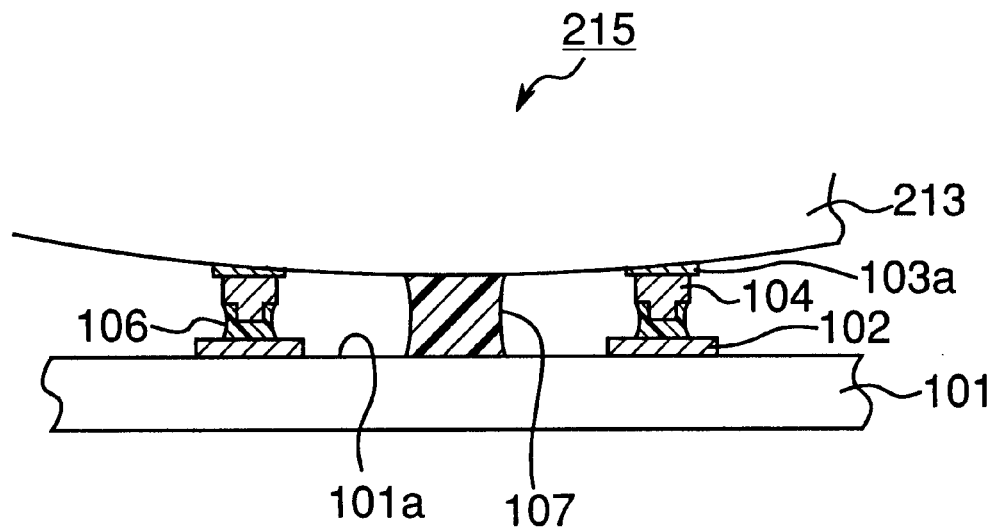
FIG. 24 is a sectional view of the semiconductor device of an embodiment in a different structure using a spherical semiconductor element.
Figure 25:
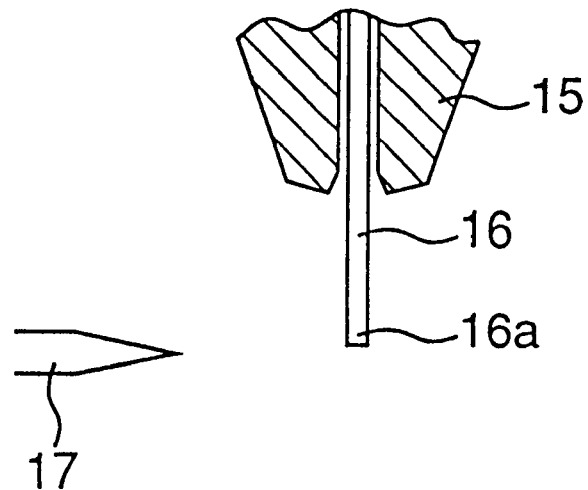
FIG. 25 is a diagram of one step of a process for forming a projecting electrode on an electrode of a semiconductor element, specifically indicating a leading end part of a capillary.
Figure 26:
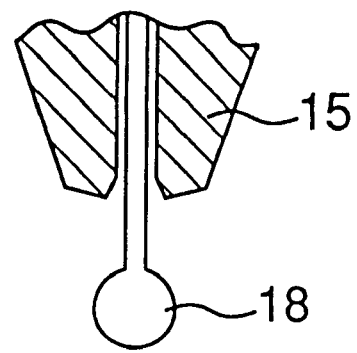
FIG. 26 is a diagram of one step of the process for forming the projecting electrode on the electrode of the semiconductor element, specifically showing a state with a ball formed at the leading end of the capillary.
Figure 27:
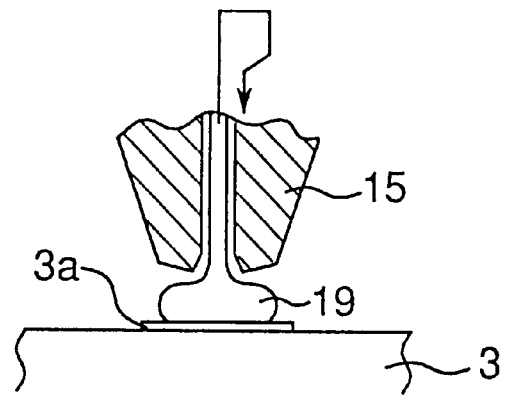
FIG. 27 is a diagram of one step of the process for forming the projecting electrode on the electrode of the semiconductor element, specifically showing a state with the ball of FIG. 26 pressed to the electrode on the semiconductor element.
Figure 28:
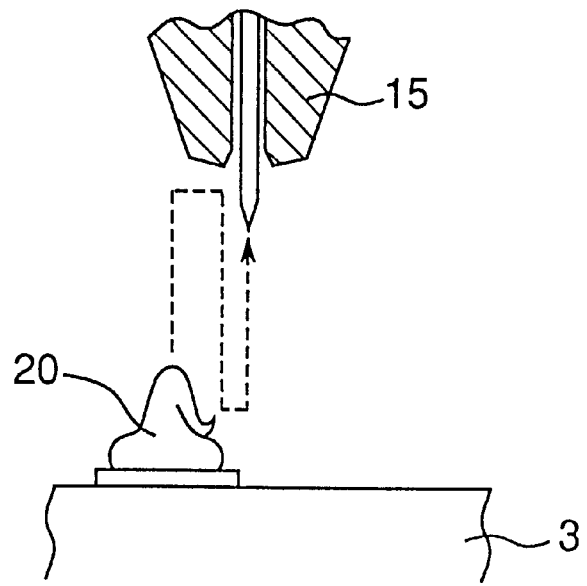
FIG. 28 is a diagram of one step of the process for forming the projecting electrode on the electrode of the semiconductor element, specifically showing a state with the projecting electrode formed on the electrode on the semiconductor element.
Figure 29:
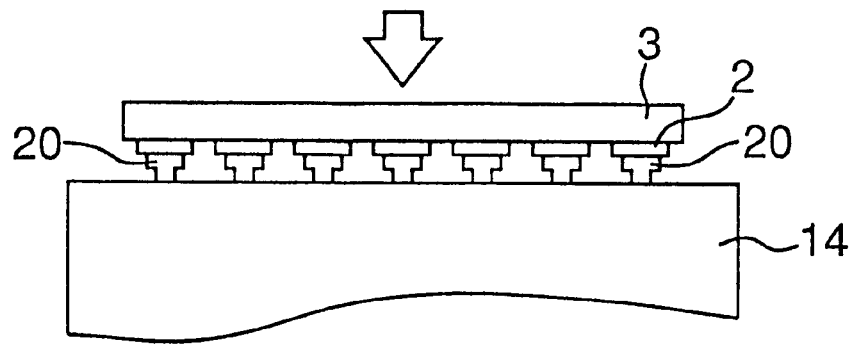
FIG. 29 is a diagram of one step of the process for forming the projecting electrode on the electrode of the semiconductor element, specifically showing a state where projecting electrodes are made uniform in height.
Figure 30:
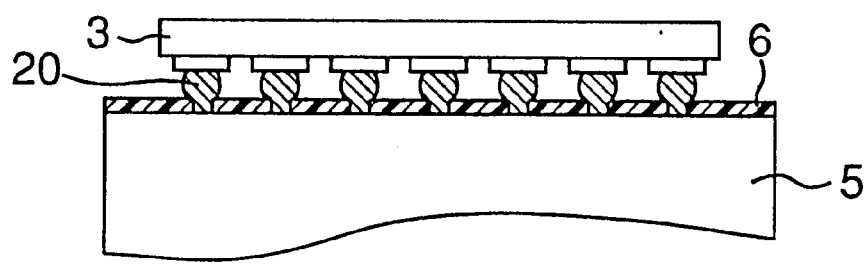
FIG. 30 is a diagram of one step of the process for forming the projecting electrode on the electrode of the semiconductor element, specifically showing a state where a conductive adhesive is transferred to the projecting electrodes.
Figure 31:
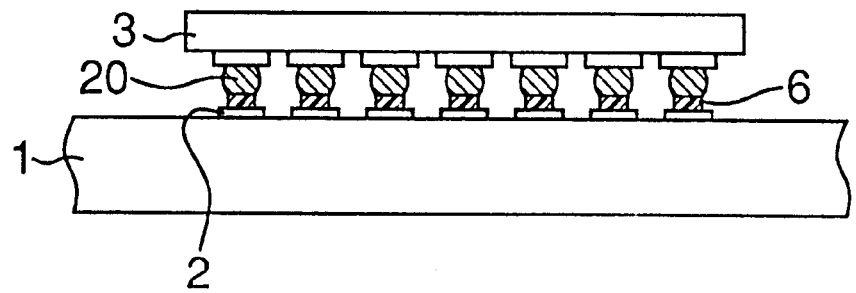
FIG. 31 is a diagram of a conventional semiconductor device.

Although the semiconductor element 103 is flat in the foregoing example, the mount method is not limited to the example and is applicable to a spherical semiconductor element 213 as shown in FIG. 24. A semiconductor device 215 is obtained with the spherical semiconductor element mounted to the circuit board with the use of the mount method of the above embodiment.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for mounting a semiconductor element to a circuit board, comprising:

disposing an insulating adhesive, having a property of shrinking upon being set, at least at either of confronting faces of the circuit board and the semiconductor element;

registering said circuit board and said semiconductor element such that an electrode on said circuit board corresponds to a projecting electrode on said semiconductor element;

coupling said confronting faces of said circuit board and said semiconductor element to one another via said insulating adhesive;

setting said insulating adhesive such that said electrode on said circuit board and said projecting electrode on said semiconductor element become electrically interconnected through shrinkage of said insulating adhesive, whereby said semiconductor element and said circuit board become fixed in a coupled state; and then injecting a sealing resin agent into a gap between said circuit board and said semiconductor element from a side end face of said semiconductor element and portions of said semiconductor element that neighbor said side end face, wherein injecting the sealing resin agent into the gap between said circuit board and said semiconductor element includes (i) subjecting said circuit board and said semiconductor element to a sub-atmospheric pressure, (ii) applying said sealing resin agent to an entire periphery of said semiconductor element along said side end face and said portions of said semiconductor element that neighbor said side end face under the sub-atmospheric pressure so as to seal said gap, and (iii) bringing said circuit board and said semiconductor element to atmospheric pressure such that said sealing resin agent applied to said side face and its neighboring portions of said semiconductor element invades said gap as a result of the difference between the sub-atmospheric pressure and the atmospheric pressure.

2. A method for mounting a semiconductor element to a circuit board, comprising:

disposing an insulating adhesive, having a property of shrinking upon being set, at least at either of confronting faces of the circuit board and the semiconductor element;

registering said circuit board and said semiconductor element such that an electrode on said circuit board corresponds to a projecting electrode on said semiconductor element;

coupling said confronting faces of said circuit board and said semiconductor element to one another via said insulating adhesive;

setting said insulating adhesive such that said electrode on said circuit board and said projecting electrode on said semiconductor element become electrically interconnected through shrinkage of said insulating adhesive, whereby said semiconductor element and said circuit board become fixed in a coupled state; and then subjecting said circuit board and said semiconductor element to a sub-atmospheric pressure;

covering said semiconductor element with a sealing resin agent under the sub-atmospheric pressure; and bringing said circuit board and said semiconductor element to atmospheric pressure so as to seal said semiconductor element on said circuit board with said sealing resin agent.

3. The method according to claim 2, wherein said sealing resin agent is a resin having a property of softening by application of heat, covering said semiconductor element with the sealing resin agent under the sub-atmospheric pressure includes heating said sealing resin agent under the sub-atmospheric pressure; and bringing said circuit board and said semiconductor element to said atmospheric pressure so as to seal said semiconductor element on said circuit board with said sealing resin agent includes bringing said sealing resin agent to said atmospheric pressure and setting said sealing resin agent.

4. The method according to claim 2, further comprising:

coating said sealing resin agent with a heat radiating resin after said semiconductor element is sealed by said sealing resin agent.

5. The method according to claim 2, wherein said sealing resin agent is film-shaped when used to cover said semiconductor element.

6. The method according to claim 2, wherein said sealing resin agent is in a liquid state when used to cover said semiconductor element.

* * * * *

UNITED STATES PATENT AND TRADEMARK OFFICE
CERTIFICATE OF CORRECTION

PATENT NO. : 6,651,320 B1
DATED : November 25, 2003
INVENTOR(S) : Yoshihiko Yagi et al.

It is certified that error appears in the above-identified patent and that said Letters Patent is hereby corrected as shown below:

Title page,
Item [57], ABSTRACT,
Line 25, please replace "device whereby" with -- device produced by the method, whereby --.
Line 28, please replace "stabilized low." with -- stabilized to be low --.
Lines 31-33, please replace "adhesive which are interposed between an electrode on the circuit board and the projecting electrode and set in the same process." with -- adhesive. The conductive adhesive is interposed between an electrode on the circuit board and a projecting electrode, and is set in the same process as is insulating adhesive --.
Line 37, please replace "stabilized low." with -- stabilized to be low. --.

Signed and Sealed this

Eighteenth Day of January, 2005

JON W. DUDAS
*Director of the United States Patent and Trademark Office*